(12) United States Patent
Castillejo et al.

(10) Patent No.: US 7,751,793 B2
(45) Date of Patent: Jul. 6, 2010

(54) INTEGRATED STRUCTURE OF INDUCTANCES WITH SHARED VALUES ON A SEMICONDUCTOR SUBSTRATE

(75) Inventors: Armand Castillejo, Grenoble (FR); Fabienne Rerat, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 1214 days.

(21) Appl. No.: 11/294,802

(22) Filed: Dec. 6, 2005

(65) Prior Publication Data
US 2006/0084401 A1 Apr. 20, 2006

Related U.S. Application Data

(62) Division of application No. 09/918,792, filed on Jul. 30, 2001, now Pat. No. 6,933,313.

(30) Foreign Application Priority Data
Jul. 31, 2000 (FR) .................................. 00 10066

(51) Int. Cl.
*H04B 1/26* (2006.01)
*H01F 5/00* (2006.01)
(52) U.S. Cl. ........................ 455/323; 455/326; 455/292; 336/200
(58) Field of Classification Search ................. 455/323, 455/326, 327, 328, 333, 340; 333/4, 5, 124, 333/129, 131, 132
See application file for complete search history.

(56) References Cited
U.S. PATENT DOCUMENTS

| | | | | |
|---|---|---|---|---|
| 3,727,078 A | * | 4/1973 | Wollesen | 327/113 |
| 3,737,681 A | * | 6/1973 | Rothermel | 327/168 |
| 4,449,245 A | * | 5/1984 | Rabe | 455/319 |
| 4,637,069 A | * | 1/1987 | Charbonnier | 455/330 |
| 4,816,784 A | * | 3/1989 | Rabjohn | 333/24 R |
| 5,006,811 A | * | 4/1991 | Kruger | 329/354 |
| 5,140,705 A | * | 8/1992 | Kosuga | 455/318 |
| 5,430,895 A | * | 7/1995 | Huusko | 455/327 |
| 5,477,204 A | * | 12/1995 | Li | 336/200 |

(Continued)

FOREIGN PATENT DOCUMENTS
DE 39 41 323 A1 6/1990

(Continued)

OTHER PUBLICATIONS

Cheung, D. et al., "Monolithic Transformers for Silicon RF IC Design," in *Proceedings of the Melecon Conferences*, IEEE, New York, May 18, 1998, pp. 105-108.

*Primary Examiner*—Duc M Nguyen
(74) *Attorney, Agent, or Firm*—Lisa K. Jorgenson; Harold H. Bennett, II; Seed IP Law Group PLLC

(57) ABSTRACT

An integrated circuit including a structure of inductances on a semiconductor substrate, intended for operating at frequencies greater than several hundreds of MHz, including a first inductance formed by a conductive track and having first and second terminals respectively connected to each of the two ends of the conductive track, including a second inductance formed by the conductive track between the second terminal and any intermediary point of the conductive track connected to a third terminal, said second and third terminals forming the two terminals of the second inductance, and means for setting the third terminal to high impedance when the first inductance is used.

14 Claims, 4 Drawing Sheets

U.S. PATENT DOCUMENTS

| | | | |
|---|---|---|---|
| 5,774,801 A * | 6/1998 | Li et al. | 455/326 |
| 5,874,883 A | 2/1999 | Uemura et al. | 336/200 |
| 5,892,425 A | 4/1999 | Kuhn et al. | 336/200 |
| 5,917,386 A * | 6/1999 | Dobrovolny | 333/119 |
| 6,026,286 A | 2/2000 | Long | 455/327 |
| 6,285,865 B1 | 9/2001 | Vorenkamp et al. | 455/307 |
| 6,993,313 B2 * | 1/2006 | Castillejo et al. | 455/333 |
| 7,072,636 B2 * | 7/2006 | Dobrovolny | 455/313 |
| 2005/0156700 A1 | 7/2005 | Chang | 336/200 |

FOREIGN PATENT DOCUMENTS

| | | |
|---|---|---|
| EP | 0 940 826 A2 | 9/1999 |

* cited by examiner

INTEGRATED STRUCTURE OF INDUCTANCES WITH SHARED VALUES ON A SEMICONDUCTOR SUBSTRATE

CROSS-REFERENCE TO RELATED APPLICATION

This application is a divisional of U.S. patent application Ser. No. 09/918,792, filed Jul. 30, 2001, now pending, which application is incorporated herein by reference in its entirety.

BACKGROUND OF THE INVENTION

1. Field of Invention

The present invention relates to inductances with shared values formed on a semiconductor substrate, and especially to such inductances intended for operating in a range of frequencies greater than several hundreds of MHz, which will be here called the RF range.

2. Description of the Related Art

FIG. 1 schematically shows a perspective view of an inductance L integrated on a semiconductor substrate 1, intended for operating in the RF range. Inductance L includes a substantially planar conductive track 2 deposited on a first insulating layer 5 of the semiconductor substrate. Conductive track 2 forms a winding comprised of a succession of rectilinear segments arranged between a first end 3, on the external side of the winding, and a second end 4, on the internal side of the winding. The rectilinear segments forming the winding are substantially parallel two by two and separated by a constant distance. A first terminal A of inductance L is formed by end 3 of track 2. A second terminal B of inductance L is connected to end 4 of track 2 via a conductive segment 6 passing under the segments of track 2.

FIG. 2 schematically shows a circuit 8 for receiving RF signals using integrated inductances. Circuit 8 includes a first processing chain T1 enabling reception of signals modulated on a carrier of frequency f1, for example, on the order of 900 MHz, and a second processing chain T2 enabling reception of signals modulated on a carrier of frequency f2, for example on the order of 1800 MHz. Such a circuit is useable in a device like a cell phone provided for operating either only with frequency f1, or only with frequency f2, or indifferently with one of frequencies f1 or f2.

Circuit 8 includes an input 10 connected to an antenna 12. The first processing chain T1 includes a low-noise amplifier 14, a mixer 16, and a first local oscillator (not shown). Amplifier 14, provided for amplifying signals modulated on a carrier of frequency f1, is connected to input 10 and provides a differential signal to mixer 16. Mixer 16 further receives a sinusoidal signal of frequency f11 provided by the first local oscillator. It provides a signal of intermediary frequency IF=f1−f11 to an output 18. The second processing chain T2 includes a low-noise amplifier 20, a mixer 22, and a second local oscillator (not shown). Amplifier 20, provided to amplify signals modulated on a carrier of frequency f2, is connected to input 10 and provides a differential signal to mixer 22. Circuit 22 also receives a sinusoidal signal of frequency f12 generated by the second local oscillator and provides a signal of intermediary frequency IF=f2−f12 to output 18, the intermediary frequencies provided by mixers 16 and 22 being the same. A control means (not shown) activates one of the processing chains according to the desired frequency.

Mixer 16 includes a so-called "Gilbert cell" (not shown), having terminals G1 and G2 respectively connected to the first terminals A1, A2 of two inductances L1 and L2. The second terminals B1 and B2 of inductances L1 and L2 are connected to the circuit ground. Inductances L1 and L2 have equal values. When the Gilbert cell operates, the alternating currents flowing through inductances L1 and L2 have the same frequency, the same absolute value, and opposite directions. The value of inductances L1 and L2 is inversely proportional to the operating frequency.

Similarly, mixer 22 includes a Gilbert cell (not shown) having two terminals G3 and G4 respectively connected to the first terminals A3, A4 of two inductances L3 and L4. The second terminals B3, B4 of inductances L3 and L4 are connected to the circuit ground. Inductances L3 and L4 have equal values. Frequency f2 being greater than frequency f1, inductances L3 and L4 have a value smaller than that of inductances L1, L2.

In an implementation in integrated form of circuit 8, the four inductances L1, L2, and L3, L4 occupy a significant surface area, which increases the cost of the integrated circuit.

SUMMARY OF THE INVENTION

An embodiment of the present invention provides an inductance structure occupying a reduced surface on a semiconductor substrate.

Another embodiment of the present invention provides an integrated circuit including a structure of inductances on a semiconductor substrate, intended for operating at frequencies greater than several hundreds of MHz, including a first inductance formed by a conductive track and having first and second terminals respectively connected to each of the two ends of the conductive track, including a second inductance formed by the conductive track between the second terminal and any intermediary point of the conductive track connected to a third terminal, said second and third terminals forming the two terminals of the second inductance, and means for setting the third terminal to high impedance when the first inductance is used.

According to an embodiment of the present invention, the conductive track is formed of rectilinear segments.

According to an embodiment of the present invention, the conductive track is substantially of octagonal shape.

According to an embodiment of the present invention, said intermediary point is connected to the third terminal via a rectilinear conductive segment.

According to an embodiment of the present invention, said conductive segment is substantially perpendicular to the conductive track.

According to an embodiment of the present invention, the circuit includes at least one second inductance structure symmetrical to the first structure and formed of the same elements, in which the conductive tracks of the first and second structures are interleaved so that the two conductive tracks have the same length, and in which the distances from each of the intermediary points of each of the conductive tracks of the first and second inductance structures to the second end of said conductive tracks are equal.

According to an embodiment of the present invention, the circuit includes first and second processing chains, the first chain including a first mixer adapted to using a first frequency and the second chain including a second mixer adapted to using a second frequency, the first terminal of the first inductance being connected to the first mixer, the second terminal of the first inductance being connected to a circuit ground, and the third terminal of the second inductance being connected to the second mixer.

According to an embodiment of the present invention, the circuit includes a second inductance structure identical to the first structure, the first terminal of the first inductance of the second structure being connected to the first mixer, the second terminal of the first inductance of the second structure being connected to the circuit ground, and the third terminal of the second inductance of the second structure being connected to the second mixer.

The foregoing objects, features and advantages of the present invention, will be discussed in detail in the following non-limiting description of specific embodiments in connection with the accompanying drawings.

DETAILED DESCRIPTION OF THE INVENTION

Only those elements likely to ease the understanding of the present invention have been shown. Same references refer to same elements in the different drawings.

An embodiment of the present invention provides forming an integrated circuit including an inductance structure comprised of a first inductance formed of a conductive track, and of a second inductance formed between one end of the conductive track and any point of the conductive track, connected to a terminal by a connection conductive segment. Thus, a bi-band circuit like circuit 8 can use either the first inductance or the second inductance according to its operating mode.

Such an inductance structure implies the connection of a conductive segment to any intermediary point of the first inductance. Now, those skilled in the art have a strong prejudice following which the connection of such a conductive segment creates insuperable problems. Especially, those skilled in the art of the field of RF frequencies would think that a conductive segment connected to any point of the first inductance would increase the stray capacitance of the track forming the first inductance in a manner which would be difficult to quantify. Now, an increase in the stray capacitance of an inductance decreases the resonance frequency of a circuit incorporating this inductance. Further, those skilled in the art consider that the presence of an intermediary connection point causes an electromagnetic coupling due to the modified parasitic elements between the conductive segment and the conductive track, likely to modify the values of the inductances in a manner which is difficult to quantify.

A contribution of the present inventors has been to perform tests and to notice that the modification of the resonance frequencies of the first and second inductances by the unused conductive track segments is actually negligible if the first and second inductances are not simultaneously used, and if the ends of the unused track segments, and at least that of the conductive segment connected to the intermediary point, are maintained at high impedance.

Figure 3:
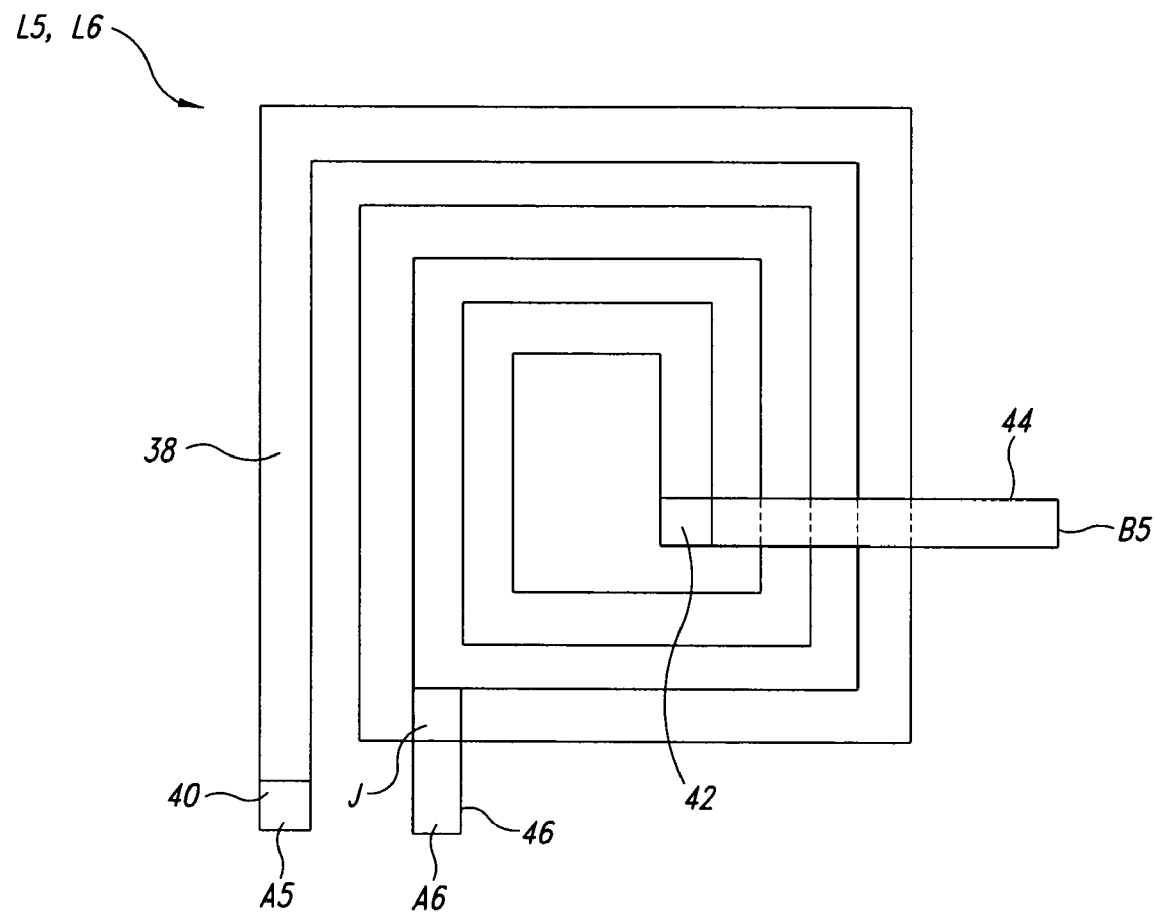
FIG. 3 schematically shows a top view of an inductance structure according of the present invention.

FIG. 3 schematically shows a top view of an inductance structure L5, L6 according to an embodiment of the present invention. Inductance L5 includes a conductive track 38 forming a winding comprised of a succession of rectilinear segments between a first end 40, on the external side of the winding, and a second end 42, on the internal side of the winding. A first terminal A5 of inductance L5 is formed by the first end 40 of track 38. A second terminal B5 of inductance L5 is connected to the second end of track 38 via a first conductive segment 44. An inductance L6 is formed by the portion of conductive layer 38 located between end 42 and a predetermined point J of track 38. A second conductive segment 46 enables connecting point J to a first terminal A6 of inductance L6. Preferably, conductive segment 46 is substantially perpendicular to the segments of track 38. The second terminal of inductance L6 is formed by terminal B5.

The applicant has acknowledged that, even in the RF range, the coupling existing between conductive segment 46 and track 38 has a negligible influence upon the value of inductance L5 when terminal A6 is maintained at high impedance.

Inductance structure L5, L6 substantially occupies the same surface as inductance L5 alone, which represents a considerable surface area gain. This structure applies to any circuit using a single one of the two inductances L5, L6 at a time during which the terminal of the unused inductance can be maintained at high impedance.

Figure 1:
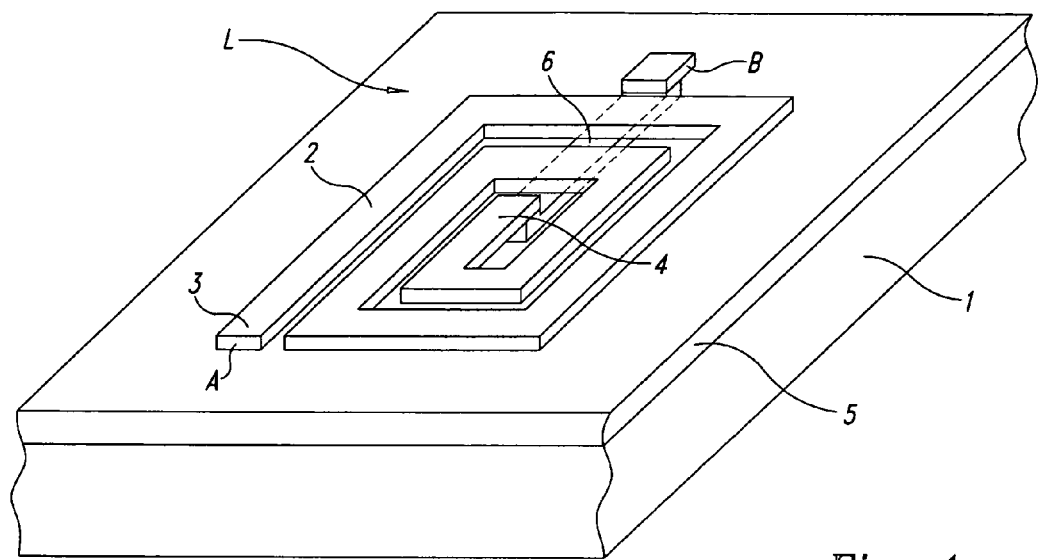
FIG. 1, previously described, shows a perspective view of a conventional inductance.
Figure 2:
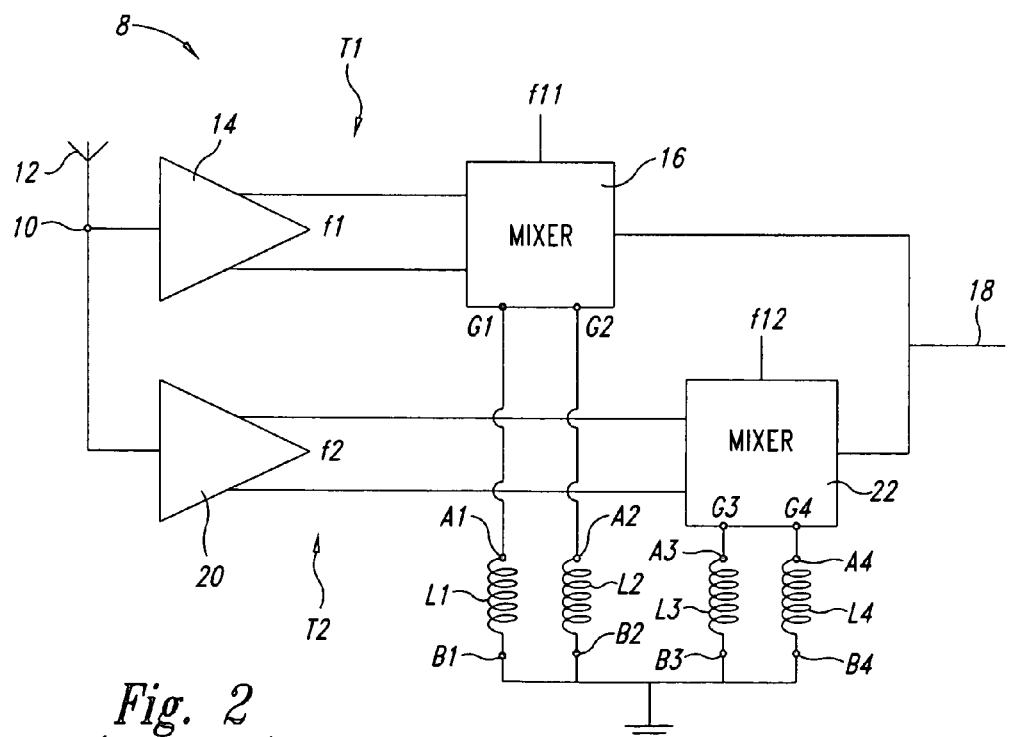
FIG. 2, previously described, schematically shows a circuit using several inductances.
Figure 4:
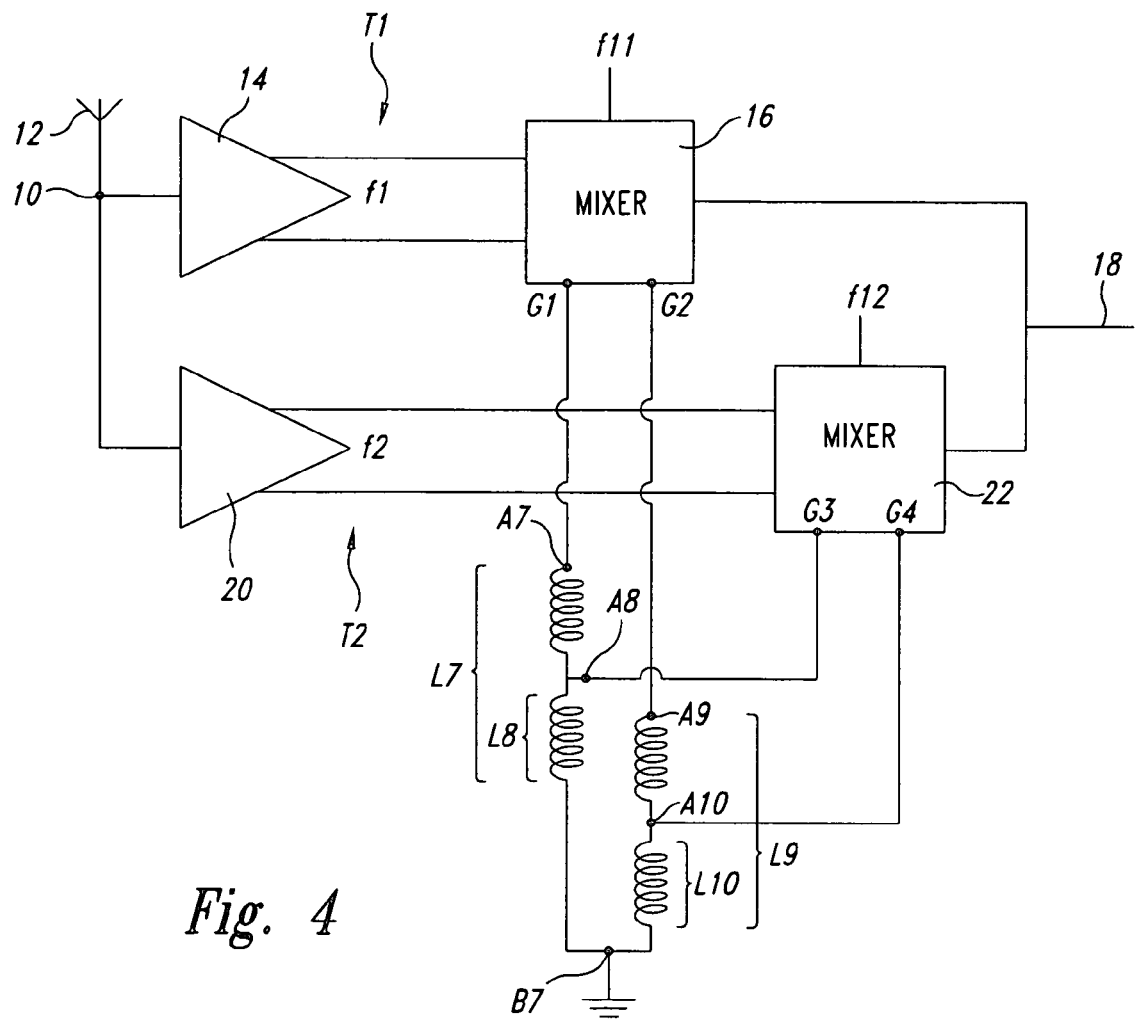
FIG. 4 schematically shows a circuit using the inductance structure according to the present invention.

FIG. 4 illustrates a bi-band circuit similar to that of FIG. 2, in which same references designate same elements.

Two inductance structures L7, L8 on the one hand, and L9, L10 on the other hand, replace inductances L1, L3, and L2, L4 of the circuit of FIG. 2. Terminal G1 of mixer 16 is connected to the first terminal, A7, of inductance L7. The second terminal, B7, of inductance L7 is grounded. Terminal G3 of mixer 22 is connected to the first terminal, A8, of inductance L8. Similarly, terminal G2 of mixer 16 is connected to the first terminal, A9, of inductance L9. The second terminal of inductance L9 is grounded. Terminal G4 of mixer 22 is connected to the first terminal, A10, of inductance L10.

When the first processing chain T1 is used, mixer 16 is activated and mixer 22 is deactivated. Inductances L7 and L9 are then used. Terminals G3, G4 of mixer 22, which is deactivated, are at high impedance. Similarly, when the second processing chain T2 is used, mixer 22 is activated and mixer 16 is deactivated. Inductances L8 and L10 are used. Terminals G1, G2 of mixer 16, which is deactivated, then are at high impedance.

The surface area occupied by inductance structures L7, L8, and L9, L10 according to the present invention is substantially half the surface area occupied by inductances L1, L2, L3, and L4.

Figure 5:
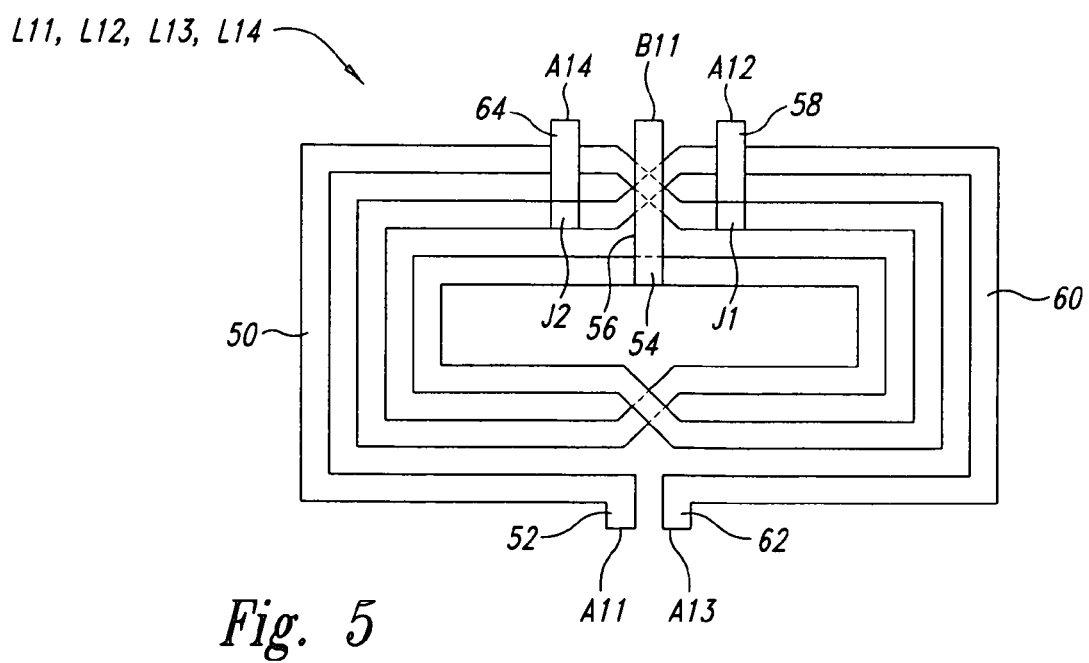
FIG. 5 schematically shows a top view of a first alternative of the present invention.

FIG. 5 schematically shows a top view of a device including two structures of two inductances according to the present invention, respectively L11, L12, and L13, L14, which are symmetrical and interleaved. The first inductance L11 includes a conductive track 50 formed of a succession of rectilinear segments arranged in a winding between a first end 52, on the external side of the winding, and a second end 54, on the internal side of the winding. The first terminal A11 of inductance L11 is formed by end 52 of track 50. The second terminal B11 of inductance L11 is connected to end 54 of track 50 via a conductive segment 56.

Inductance L12 is formed by the portion of conductive track 50 located between end 54 and a predetermined point J1 of track 50. A conductive segment 58 enables connecting point J1 to a first terminal A12 of inductance L12. The second terminal of inductance L12 is formed of terminal B11.

Inductance L13 includes a conductive track 60 formed of a succession of rectilinear segments arranged according to a symmetrical winding with respect to the winding of conductive track 50. The segments of track 60 cross the segments of track 50 in several points, by a contactless overlapping.

Tracks 50, 60 have the same length and inductances L11 and L13 have the same value. Track 60 includes a first end 62, on the external side of the winding, and a second end formed by the second end 54 of track 50. The first terminal A13 of inductance L13 is formed by end 62 of track 60. The second terminal of inductance L13 is common with the second terminal B11 of inductance L1.

Inductance L14 is formed by the portion of conductive track 60 located between end 54 and a predetermined point J2 of track 60. A conductive segment 64 enables connecting point J2 to a first terminal A14 of inductance L14. The second terminal of inductance L14 is formed by terminal B11.

Such an arrangement of tracks 50 and 60 can be used in the circuit of FIG. 2. Thus, the two inductances L11, L13 can be used to replace inductances L1 and L2 while the two inductances L12 and L14 may be used to replace inductances L3 and L4. Further, the proximity of terminals A11 and A13 eases the connection of inductance pair L11 and L13 respectively to terminals G1 and G2 of mixer 16 by tracks of same length and same impedance. Similarly, the proximity of terminals A12 and A14 eases the connection of inductance pair L12 and L14 respectively to terminals G3 and G4 of mixer 22.

Of course, the present invention is likely to have various alterations, modifications, and improvements which will readily occur to those skilled in the art. Thus, the use of an inductance structure according to the present invention in a bi-band receive circuit such as the circuit of FIG. 4 has been described. Of course, the inductance structure according to the present invention can be used in a bi-band transmit circuit and, generally, in any circuit comprised of two inductances used non-simultaneously.

Further, although, for clarity, inductances according to the present invention having a winding with a substantially square or rectangular shape have been shown in FIGS. 3 and 5, those skilled in the art will easily adapt the present invention to inductances having a winding with any shape.

Figure 6:
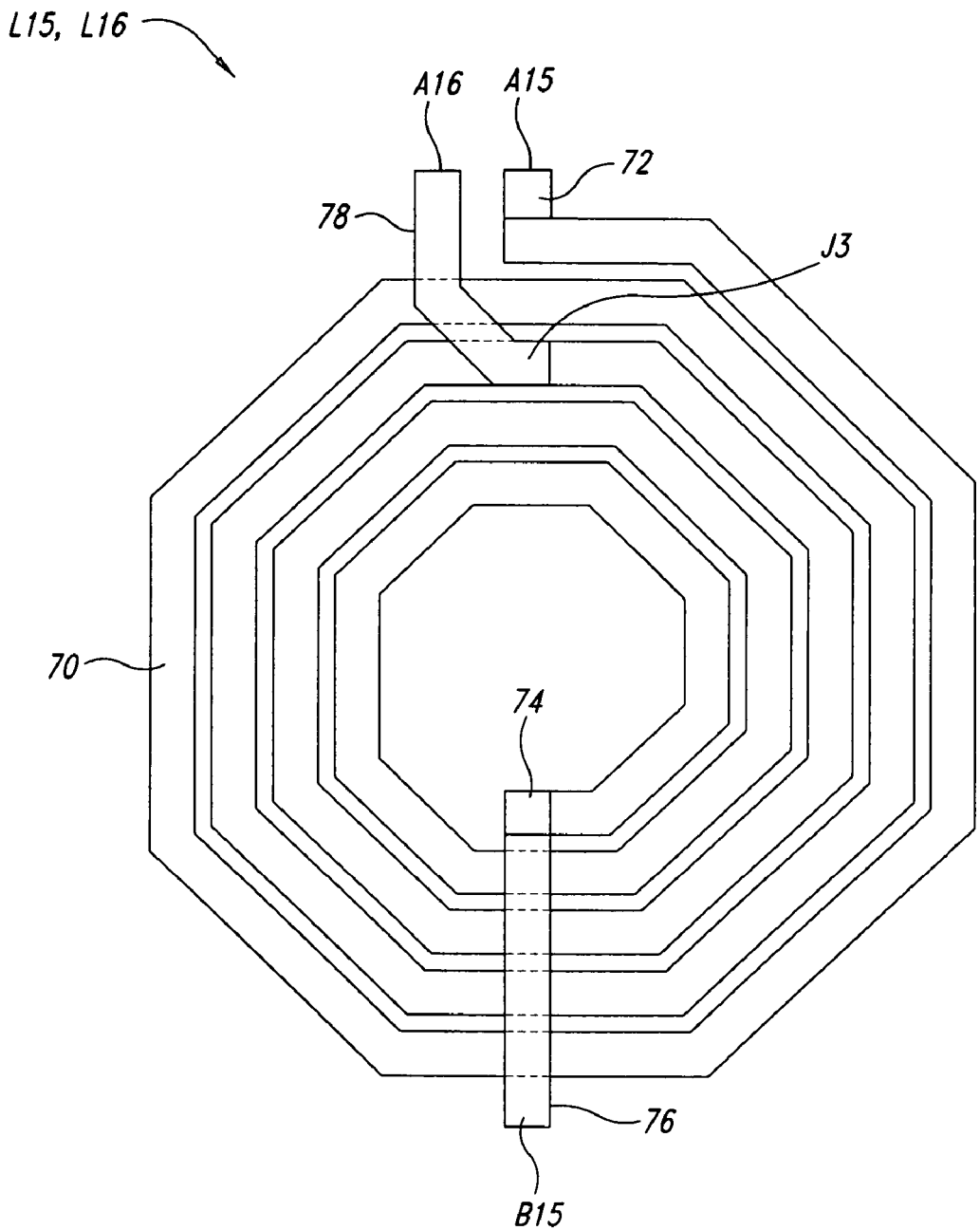
FIG. 6 schematically shows a top view of a second alternative of the present invention.

As an example, FIG. 6 shows an inductance structure L15, L16 according to the present invention, the conductive track 70 of which has a substantially octagonal shape between a first end 72, on the external side of the winding, and a second end 74, on the internal side of the winding. A first terminal A15 of inductance L15 is formed by first end 72 of track 70. A second terminal B15 of inductance L15 is connected to second end 74 of track 70 via a conductive segment 76. Inductance L16 is formed by the portion of conductive track 70 located between end 74 and a point J3. A second conductive segment 78 enables connecting point J3 to a first terminal A16 of inductance L16. The second terminal of inductance L16 is formed by terminal B15.

In the foregoing description, the second inductance of the inductance structures according to the present invention is formed by the portion of the conductive track located between the second terminal of the first inductance and a predetermined point. However, those skilled in the art will easily adapt the present invention to the case where the second inductance is formed by the portion of the conductive layer located between the first terminal and said predetermined point.

Only inductance structures according to the present invention using one conductive track and including two inductances have been described, the second inductance being formed between a predetermined point of the conductive track and one end of the conductive track. The prejudice discarding the possibility of branching a conductive segment at any point of the conductive track having been overcome, it is believed that it is possible to adapt the present invention to a structure comprised of three inductances or more, each inductance being formed between a specific predetermined point of the conductive track and one end of the conductive track.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

We claim:

1. A method, comprising:
receiving a first signal modulated on a first carrier frequency;
demodulating the first signal using a circuit that includes first and second inductors formed on a semiconductor substrate, the first and second inductors including first and second conductive tracks, each track having first and second terminals connected to the respective conductive tracks at first and second ends thereof;
receiving a second signal modulated on a second carrier frequency; and
demodulating the second signal using a circuit that includes third and fourth inductors formed on a semiconductor substrate, where the third inductor is a portion of the first inductor, defined by a segment of the first conductive track between the second terminal of the first conductive track and a third terminal of the first conductive track, connected to an intermediate point of the first conductive track, and the fourth inductor is a portion of the second inductor, defined by a segment of the second conductive track between the second terminal of the second conductive track and a third terminal of the second conductive track, connected to an intermediate point of the second conductive track.

2. The method of claim 1 wherein, while the demodulating the first signal step is performed, the third terminals of the first and second conductive tracks are maintained at high impedance.

3. The method of claim 1 wherein the first and second inductors are of equal inductive value, and the third and fourth inductors are of equal inductive value.

4. The method of claim 1, wherein the first and second conductive tracks are interleaved so that the two conductive tracks have the same length, and wherein the distances from each of the third terminals of the first and second conductive tracks to the respective second terminals of the conductive tracks are equal.

5. The method of claim 4 wherein the first and second conductive tracks share a common second end and second terminal.

6. A method, comprising:
electrically coupling a first circuit formed on a substrate of semiconductor material to first and second terminals at first and second ends, respectively, of a first inductor formed on the substrate;
placing a third terminal, connected to an intermediate portion of the first inductor, at a high impedance;
electrically coupling the first circuit to fourth and fifth terminals at first and second ends, respectively, of a second inductor formed on the substrate, the first and second inductors being symmetrical and interleaved;
placing a sixth terminal, connected to an intermediate portion of the second inductor, at a high impedance;
receiving a first signal modulated at a first frequency; and
demodulating the signal, using the first circuit and the first and second inductances.

7. The method of claim 6, comprising:
electrically coupling a second circuit formed on the substrate to the first and third terminals of the first inductor; and
placing the second terminal at a high impedance.

8. The method of claim 7 wherein the first and second circuits are comprised by a third circuit, as components thereof.

9. The method of claim 6, comprising:
electrically coupling a second circuit formed on the substrate to the first and third terminals of the first inductor;
electrically coupling the second circuit to the fourth and sixth terminals of the second inductor;
placing the second and fifth terminals at a high impedance;
receiving a second signal modulated at a second frequency, different from the first frequency; and
demodulating the second signal, using the second circuit and the first and second inductances.

10. The method of claim 9 wherein the first, and second circuits are comprised by a third circuit, as components thereof.

11. A method, comprising:
forming, on a substrate of semiconductor material, a first inductive structure including a first conductive track;
forming, on the substrate, first and second connection points at first and second ends, respectively, of the first conductive track;
forming, on the substrate, a third connection point at an intermediate portion of the first conductive track; and
forming, on the substrate, a circuit having first, second, and third terminals in electrical contact with the first, second, and third connection points, respectively, the circuit being configured to perform a first operation, with respect to a signal modulated at a first frequency, utilizing a first inductor formed by the first conductive track extending between the first and second connection points, and a second operation, with respect to a signal modulated at a second frequency, utilizing a second inductor formed by the first conductive track extending between the first and third connection points.

12. The method of claim 11, comprising:
forming, on the substrate, a second inductive structure including a second conductive track;
forming, on the substrate, fourth and fifth connection points at fourth and fifth ends, respectively, of the second conductive track; and
forming, on the substrate, a sixth connection point at an intermediate portion of the second conductive track.

13. The method of claim 12 wherein the first and second conductive tracks are symmetrical and interleaved.

14. The method of claim 12,
wherein the circuit includes fourth, fifth, and sixth terminals in electrical contact with the fourth, fifth, and sixth connection points, respectively, the circuit being configured to perform a third operation, with respect to the signal modulated at the first frequency, utilizing a third inductor formed by the second conductive track extending between the fourth and fifth connection points, and a fourth operation, with respect to the signal modulated at the second frequency, utilizing a fourth inductor formed by the second conductive track extending between the fourth and sixth connection points.

* * * * *

UNITED STATES PATENT AND TRADEMARK OFFICE
CERTIFICATE OF CORRECTION

PATENT NO. : 7,751,793 B2  Page 1 of 1
APPLICATION NO. : 11/294802
DATED : July 6, 2010
INVENTOR(S) : Armand Castillejo et al.

It is certified that error appears in the above-identified patent and that said Letters Patent is hereby corrected as shown below:

Title Page Item 62
 "Division of application No. 09/918,792, filed on Jul. 30, 2001, now Pat. No. 6,933,313" should read as, --Division of application No. 09/918,792, filed on Jul. 30, 2001, now Pat. No. 6,993,313--.

Column 8
Claim 14, Line 19, "The method of claim 12," should read as --The method of claim 12--.

Signed and Sealed this
Fifteenth Day of February, 2011

David J. Kappos
*Director of the United States Patent and Trademark Office*